US005793608A

United States Patent [19]
Winick et al.

[11] Patent Number: 5,793,608
[45] Date of Patent: Aug. 11, 1998

[54] COOLING SYSTEM FOR ENCLOSED ELECTRONIC COMPONENTS

[75] Inventors: Alan Lee Winick; Nagaraj Mitty, both of San Jose; Gary A. Harpell, San Carlos, all of Calif.

[73] Assignee: Sun Microsystems, Inc., Mountain View, Calif.

[21] Appl. No.: 661,817

[22] Filed: Jun. 11, 1996

[51] Int. Cl.$^6$ ...................................... H05K 7/20
[52] U.S. Cl. ............................. 361/695; 361/687
[58] Field of Search ........................ 361/687–688, 361/690, 694–697

[56] References Cited

U.S. PATENT DOCUMENTS

| | | | |
|---|---|---|---|
| 4,277,816 | 7/1981 | Dunn et al. | 361/694 |
| 4,702,154 | 10/1987 | Dodson | 361/687 |
| 4,751,872 | 6/1988 | Lawson, Jr. | 361/687 |
| 4,911,231 | 3/1990 | Horne et al. | 361/695 |
| 5,132,780 | 7/1992 | Higgins, III | 361/694 |
| 5,361,188 | 11/1994 | Kondou et al. | 361/695 |
| 5,402,312 | 3/1995 | Kinjo et al. | 361/695 |
| 5,484,012 | 1/1996 | Hiratsuka | 361/695 |
| 5,522,700 | 6/1996 | Hong | 361/697 |
| 5,576,932 | 11/1996 | Bishop et al. | 361/697 |

FOREIGN PATENT DOCUMENTS

| | | | |
|---|---|---|---|
| 3306696 | 12/1988 | Japan | 361/695 |
| 5206668 | 8/1993 | Japan | 361/697 |

*Primary Examiner*—Gregory D. Thompson
*Attorney, Agent, or Firm*—Flehr Hohbach Test Albritton & Herbert LLP; Julian Caplan

[57] ABSTRACT

An enclosure contains, among other components, hard drive cartridges, graphics or other option cards, power supply and a CPU and its support chips. The total power in the whole enclosure is about 325W and the CPU consumes about 30W of this total. For design purposes the components are closely positioned and hence heat dissipation is an important problem. Plural fans, as hereinafter disclosed, are used to circulate air. For the hard drive cartridges a fan snapped into a sidewall of the enclosure draws air from apertures in the bottom through the cartridge and into a plenum. For the CPU, an impingement fan discharges air directly downward on a heat sink positioned over the chip and into the plenum. Bulk flow fans discharge air from air intake vents in side walls of the enclosure as well as air discharged from the hard drive and CPU through an internal wall into a separate sub-enclosure for the power supply and thence to the exterior. Conventional fans are used but are positioned and inter-related so that the noise level is tolerable.

4 Claims, 3 Drawing Sheets

5,793,608

COOLING SYSTEM FOR ENCLOSED ELECTRONIC COMPONENTS

BACKGROUND OF THE INVENTION

1. Field of the Invention

This invention relates to a new and improved cooling system for enclosed electronic components, such as the important components of a computer.

2. Related Art

Computer housings typically contain a chassis which supports an outer cover or shell. Within the chassis are various electronic components which generate heat during operation. Such components include electronic cards which are plugged into a motherboard, a power supply and storage devices such as hard disk drives and floppy disk drives, among others. Prior art computers typically contained one or more fans which created a flow of air to remove the heat generated by the components.

The size of a fan used in such a housing is limited by the height of the chassis. An electrical system which generates more heat than an existing design must be accompanied by more fans or fans which create a higher flow rate. The flow rate is typically increased by raising the voltage level provided to the fan motors, but this undesirably increases the noise emitted by the fan.

The advantage of the present invention over prior systems is more efficient cooling without emitting an undesirable level of noise.

SUMMARY OF THE INVENTION

The present invention cools many heat-emitting electronic components within an enclosed area. For example, a motherboard-based CPU cluster used with the present invention dissipates heat from approximately 45 watts located in a 10 square inch area of the board and included therein is a CPU chip occupying about 2 square inches which dissipates heat from 30 to 35 watts of power. Other chips clustered around the CPU consume in total around 45 watts. Industry standards require that the acoustic level be less than 5 Bels for the use of the device as desktop office equipment. The system further must be used where ambient temperatures are in the range of −20° C. to 40° C. and at an altitude from sea level to 10,000 feet. At the same time, venting restrictions in the front face of the enclosure are imposed by reason of industrial design requirements.

In addition to the motherboard heat emitting area, within the enclosure are hard drive devices as well as graphic boards and other circuit boards so that the total power delivery may be within the range of 180 watts to 230 watts.

One feature of the invention is the use of an impingement fan which spot cools the CPU chip by blowing directly on it. This air is simultaneously removed from the enclosure by a power supply fan adjacent the impingement fan. Extraordinary, unique thermal density dissipation is obtained.

The support chips for the CPU, including SRAMS and data buffer chips, are located adjacent the CPU chip as needed for electrical performance of the device. The proximity of hot chips poses additional thermal problems. The ancillary chips are cooled by tower disk heat sinks and are cooled by the fan system herein described.

Disk drives are located adjacent the front of the enclosure. An optional snap-in front fan cools the disk drives by blowing air directly over the disk drives. The front fan draws air from vents which are located at the intersection of the bottom of the enclosure and the front so that the air is drawn up from the vents into the fan and thence against the disk drives. Hence, no grills are visible from the front of the enclosure.

The fan which cools the disk drives, when used, is mounted in a cartridge which is snapped into a cavity behind the front wall and the fan is set back from the front wall a sufficient distance so that the air can circulate up from the bottom vents through the fan and thence into the disk drives. A thermistor on the fan senses ambient air temperature, thereby increasing the speed of the fan by regulating the voltage of its motor.

Power supply fans are controlled by another thermistor on the motherboard at the inlet side so that internal configuration does not impact the fan speed. This provides quiet room temperature performance while cooling adequately even at high altitudes and high temperatures.

BRIEF DESCRIPTION OF THE DRAWINGS:

The accompanying drawings, which are incorporated in and form a part of this specification, illustrate embodiments of the invention and, together with the description, serve to explain the principles of the invention.

DETAILED DESCRIPTION OF THE PREFERRED EMBODIMENT

Figure 1:
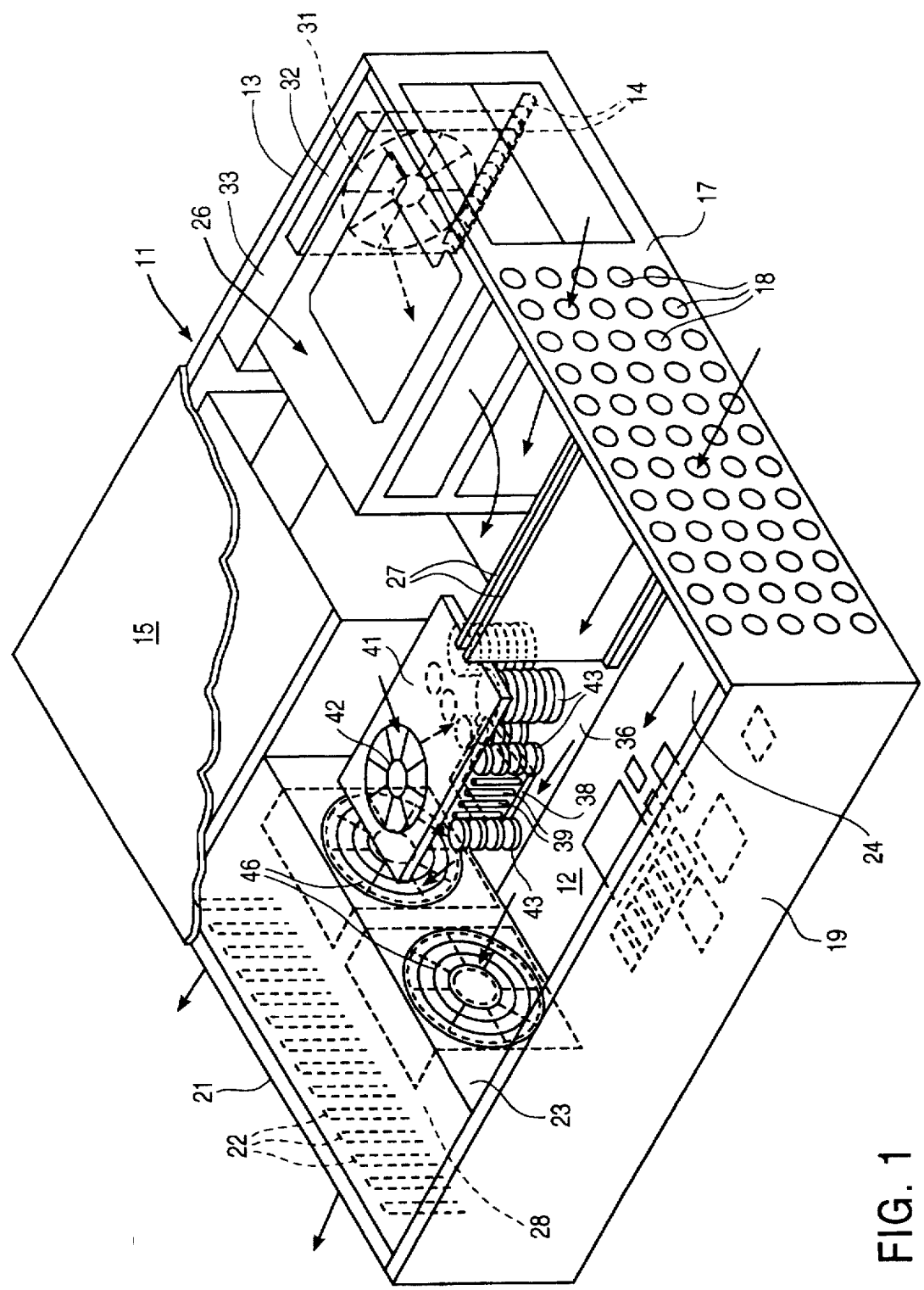
FIG. 1 is a perspective view of the enclosure in which the present invention is installed, the cover being removed for clarity of illustration.
Figure 2:
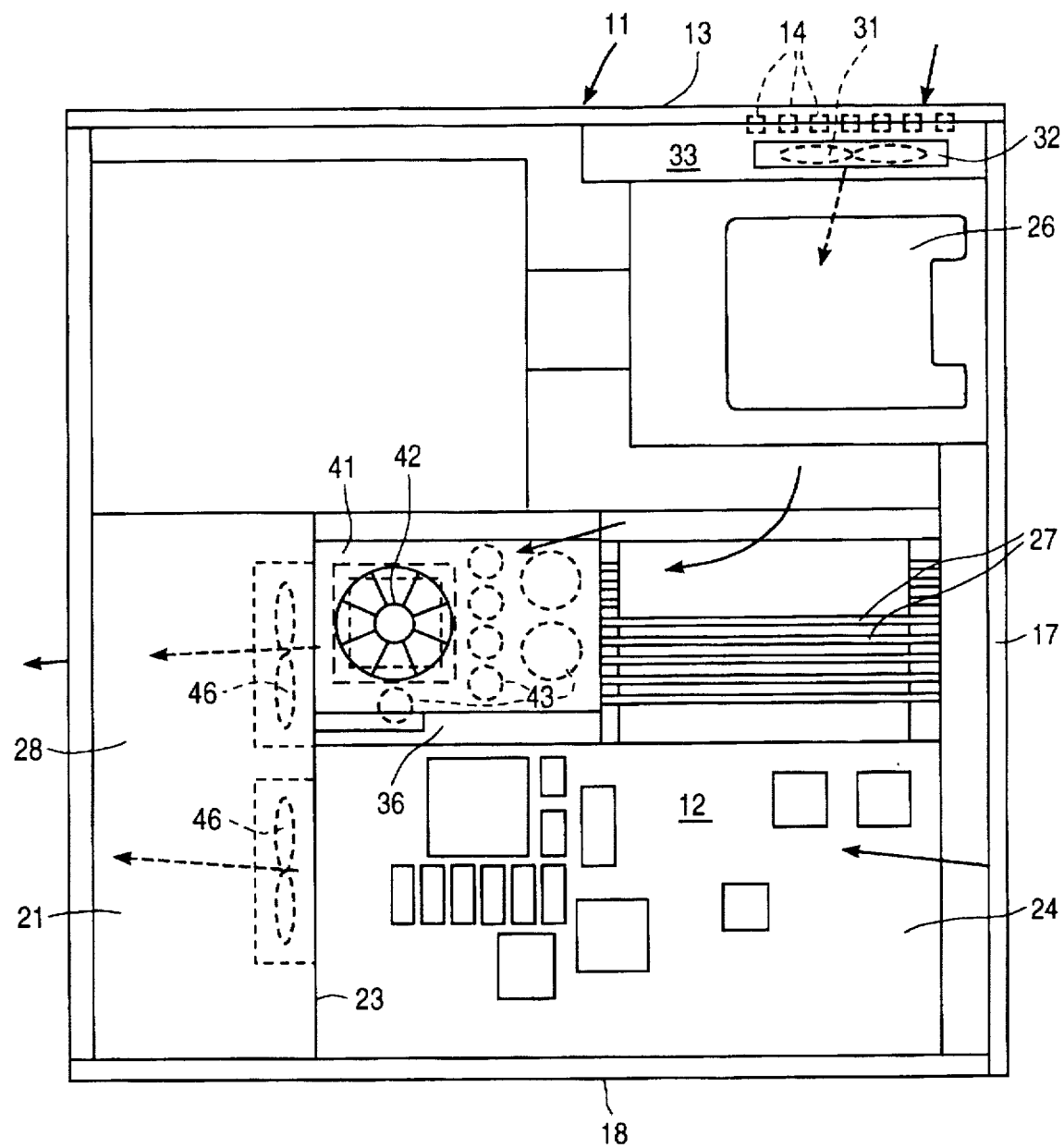
FIG. 2 is a top plan view of the structure of FIG. 1.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Enclosure 11 is formed with a substantially rectangular bottom 12 of a size to accommodate the various electrical components required in close proximity to each other, and it is the proximity of these components which raises the ventilating problems which the present invention solves. Extending upward from the four edges of bottom 12 are vertical sides. A cover 15 closes off the top of the enclosure, but for purpose of illustration this cover is removed so that the components within the enclosure are more readily apparent.

The first side or front 13 of enclosure 11 is intended to be ornamental. To preserve the ornamental appearance, ventilating vents 14 are formed in bottom 12 near the intersection of lower edge of front 13 so that air is drawn in through the vents without destroying the aesthetic appeal of the front 13.

The second side 17 is formed with a plurality of air inlet apertures 18, it being understood that most of the cooling air for the enclosure is drawn therethrough. Third side 19 is at the back. Since the back is frequently placed against a wall, ventilation apertures are not formed therein. The fourth side 21 is formed with plural discharge vents 22. An internal partition 23, generally parallel to the side 21, closes off an area in which power supply 28 (not shown) is located. An enlarged plenum 24 or input-output section is created within the enclosure 11.

Located in proximity to front 13 are hard drive units 26. Graphic cards 27 may be installed inwardly of the hard drive units 26 and other circuit boards (not shown) may be located within plenum 24.

Hard drive fan 31 is optional. When used, it is mounted in a cartridge 32 which snaps into an enclosure 33 behind front 13 so that the fan is spaced inwardly of front 13 about ¼ inch. A thermistor (not shown) in proximity to fan 31 controls the voltage and, accordingly, the rpm of fan 31. Hence, air is drawn up through vents 14 through the fan 31 and against the hard drive units 26 to cool the same. The air then travels into the plenum 24.

Figure 3:
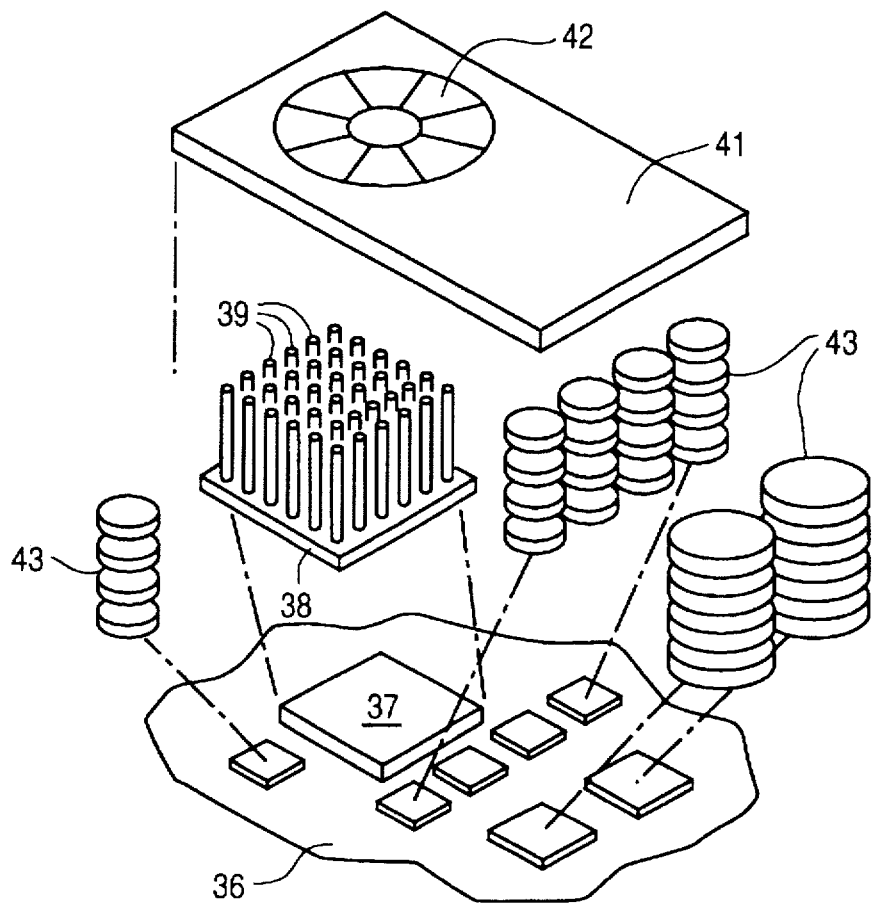
FIG. 3 is an exploded perspective view of a portion of the motherboard and CPU, its heat sink and its impingement fan.
Figure 4:
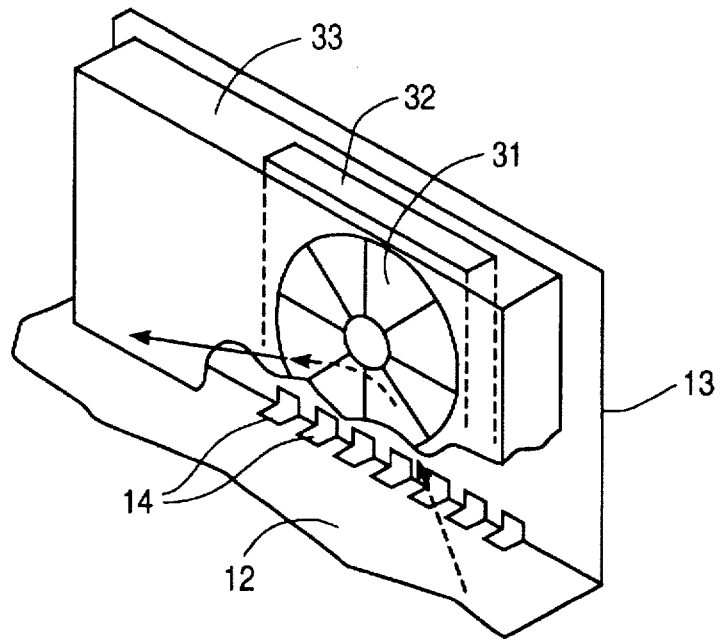
FIG. 4 is a perspective view of a portion of the device showing the hard drive installed in the front wall.

Within plenum 24 is the greatest heat emitting area located on a motherboard 26 which rests on bottom 12. The hottest element on motherboard 36 is a CPU chip 37 (see FIG. 3) using 35 watts of power. Positioned above the chip 37 is the base 38 of a heat sink. Fins 39 extend upward from base 38. Located above the upper ends of the fins 39 is a top 41 in which is mounted an impingement fan 42 which constitutes a thermal cooling module which blows air directly on the fins 39, base 38 and chip 37. The chip 37 is located in proximity to other support chips such as data buffers and SRAMS which bring the total power requirement of motherboard 36 to about 45 watts. These elements have heat sinks 43 such as tower disk heat sinks located around the heat sink base 38 and are likewise cooled by the fan 42.

An important feature of the invention is the fact that the fan 42 is located in proximity to the bulk flow system fans 46 which are mounted in interior partition 23. It is a feature of the invention that the air discharged by the fans 42 is drawn out of plenum 24 by the fans 46 in close proximity thereto. Fans 46 drive the discharged air against the power supply and out through vents 22.

The fans collectively hold the acoustic level below 5 Bel range. This is acceptable for desk top equipment.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. In combination, an enclosure comprising a bottom and four peripheral sides extending substantially vertically upward from said bottom, a first said side being formed with air inlet first apertures, a motherboard on said bottom, a heat emitting chip positioned on said motherboard, a heat sink above said chip, said heat sink comprising a base resting on said chip and a plurality of vertical fins extending upward from said base, a power supply area adjacent a second said side, a partition parallel to said second side and spaced inwardly of said power supply area, and said partition being in close proximity to said chip, said partition and said first, third and fourth sides defining a plenum, said second side being formed with air discharge second apertures, a top formed with a fan aperture above said heat sink, an impingement first fan located in said fan aperture discharging air from said plenum downward to cool said heat sink and said chip, said top engaging said partition, a second fan in said partition discharging air from said plenum and air emitted from said heat sink and said chip through said power supply area and out through said second apertures.

2. The combination of claim 1 which further comprises a plurality of second chips on said motherboard, said impingement fan discharging air on said second chips.

3. The combination of claim 2 which further comprises tower disk heat sinks on said second chips, air discharged by said impingement fan cooling said tower disk heat sinks.

4. The combination of claim 1 which further comprises a plurality of heat emitting electronic components in said plenum, said electronic components comprising at least one disk drive adjacent said third side, a hard drive fan adjacent but spaced inward of said third side directing air toward said at least one disk drive, a plurality of vents formed in said bottom adjacent said third side, said hard drive fan drawing air upward through said vents and then inwardly of said enclosure toward said disk drive and a cartridge fitting into said third side, said hard drive fan being detachably mounted in said cartridge.

* * * * *